(12) United States Patent
Trinh et al.

(10) Patent No.: US 11,967,611 B2
(45) Date of Patent: Apr. 23, 2024

(54) MULTILAYER STRUCTURE, CAPACITOR STRUCTURE AND ELECTRONIC DEVICE

(71) Applicant: TAIWAN SEMICONDUCTOR MANUFACTURING COMPANY LTD., Hsinchu (TW)

(72) Inventors: Hai-Dang Trinh, Hsinchu (TW); Yi Yang Wei, Hsinchu (TW); Fa-Shen Jiang, Taoyuan (TW); Bi-Shen Lee, Hsinchu (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/827,837

(22) Filed: May 30, 2022

(65) Prior Publication Data

US 2023/0387190 A1 Nov. 30, 2023

(51) Int. Cl.
*H01G 4/10* (2006.01)
*H01L 49/02* (2006.01)

(52) U.S. Cl.
CPC .............. *H01L 28/75* (2013.01); *H01G 4/10* (2013.01); *H01L 28/91* (2013.01)

(58) Field of Classification Search
CPC .............. H01L 28/75; H01L 28/86–92; H01L 28/56–57; H01G 4/10; H01G 4/105
See application file for complete search history.

(56) References Cited

U.S. PATENT DOCUMENTS

| | | | | |
|---|---|---|---|---|
| 10,468,478 | B2 * | 11/2019 | Huang | H01G 4/236 |
| 2001/0041250 | A1 * | 11/2001 | Werkhoven | C30B 25/14 |
| | | | | 257/E21.279 |
| 2007/0161185 | A1 * | 7/2007 | Liang | H01L 21/0217 |
| | | | | 438/257 |
| 2008/0088932 | A1 * | 4/2008 | Cho | G02B 1/113 |
| | | | | 359/586 |
| 2010/0171187 | A1 * | 7/2010 | Andreoni | H01L 21/28194 |
| | | | | 257/411 |

(Continued)

FOREIGN PATENT DOCUMENTS

KR 20190074856 A * 6/2019 ............. H01L 28/56

OTHER PUBLICATIONS

KR20190074856A—Machine English Translation (Year: 2023).*

(Continued)

*Primary Examiner* — Jose R Diaz
(74) *Attorney, Agent, or Firm* — WPAT LAW; Anthony King

(57) ABSTRACT

A multilayer structure, a capacitor structure and an electronic device are provided. The multilayer structure includes a first dielectric layer, a second dielectric layer and an intermediate dielectric layer. The intermediate dielectric layer is disposed between the first dielectric layer and the second dielectric layer. A material of the intermediate dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0.

20 Claims, 8 Drawing Sheets

(56) References Cited

U.S. PATENT DOCUMENTS

2017/0271436 A1* 9/2017 Tsui .................. H01L 28/00
2022/0140067 A1* 5/2022 Song .................. H01L 29/0847
　　　　　　　　　　　　　　　　　　　　　　　257/288

OTHER PUBLICATIONS

M. H. Zhang, S. J. Rhee, C. Y. Kang, C. H. Choi, M. S. Akbar, S. A. Krishnan, T. Lee, I. J. Ok, F. Zhu, H. S. Kim, and Jack C. Lee, "Improved electrical and material characteristics of HfTaO gate dielectrics with high crystallization temperature", Appl. Phys. Lett. 87, 232901 (2005).

Y. Yamamoto, K. Kita, K. Kyuno, and A. Toriumi, "Structural and electrical properties of HfLaOx films for an amorphous high-k gate insulator", Appl. Phys. Lett. 89, 032903 (2006).

Wei He, Daniel S. H. Chan, Sun-Jung Kim, Young-Sun Kim, Sung-Tae Kim, and Byung Jin Cho, "Process and Material Properties of HfLaOx Prepared by Atomic Layer Deposition", Journal of The Electrochemical Society, 155 (10) G189-G193 (2008).

Christoph Adelmann,* Annelies Delabie, Bart Schepers, Leonard N. J. Rodriguez, Alexis Franquet, Thierry Conard, Karl Opsomer, Inge Vaesen, Alain Moussa, Geoffrey Pourtois, Kristine Pierloot, Matty Caymax, and Sven Van Elshocht, "Atomic Layer Deposition of Tantalum Oxide and Tantalum Silicate from Chloride Precursors", Chem. Vap. Deposition 2012, 18, 225-238.

* cited by examiner

MULTILAYER STRUCTURE, CAPACITOR STRUCTURE AND ELECTRONIC DEVICE

BACKGROUND

Industry requirements for decreased size in integrated circuits (ICs) have resulted in smaller devices which consume less power yet provide more functionality at higher speeds. The miniaturization process has also resulted in stricter design and manufacturing specifications as well as reliability challenges. The integrated circuit (IC) may include one or more passive devices, such as capacitors. To achieve an increasing capacitance density of the capacitor, a leakage is an issue.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
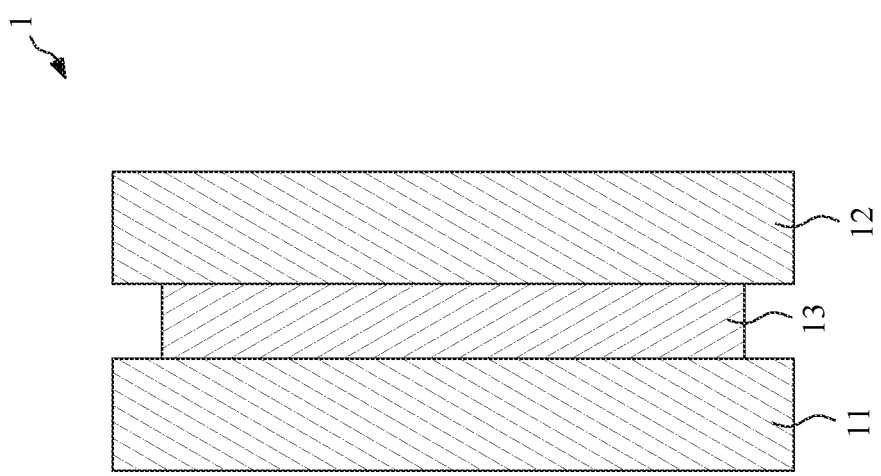
FIG. 1 illustrates a cross-sectional view of an example of a multilayer structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a cross-sectional view of an example of a multilayer structure 1 according to some embodiments of the present disclosure. In some embodiments, the multilayer structure 1 may be a portion of a capacitor. The multilayer structure 1 may include a first dielectric layer 11, a second dielectric layer 12 and an intermediate dielectric layer 13 disposed between the first dielectric layer 11 and the second dielectric layer 12. In some embodiments, the multilayer structure 1 may be disposed between two conductive layers (e.g., two electrodes). In some embodiments, the multilayer structure 1 may be a stacked structure. That is, the first dielectric layer 11, the second dielectric layer 12 and the intermediate dielectric layer 13 may be stacked on one another.

A material of the first dielectric layer 11 may be same as or different from a material of the second dielectric layer 12.

For example, the material of the first dielectric layer 11 may include hafnium oxide ($HfO_2$) and/or zirconium oxide ($ZrO_2$). The dielectric constant ($\varepsilon_k$) of the first dielectric layer 11 may be greater than 12, may be greater than 15, or may be greater than 20. Thus, the first dielectric layer 11 may be a high-k dielectric layer. The first dielectric layer 11 may be formed by physical or chemical vapor deposition, or by atomic layer deposition (ALD). A thickness of the first dielectric layer 11 may be equal to or different from a thickness of the second dielectric layer 12. For example, the thickness of the first dielectric layer 11 may be about 15 Å to about 50 Å.

The material of the second dielectric layer 12 may include hafnium oxide ($HfO_2$) and/or zirconium oxide ($ZrO_2$). The dielectric constant ($\varepsilon_k$) of the second dielectric layer 12 may be greater than 12, may be greater than 15, or may be greater than 20. Thus, the second dielectric layer 12 may be a high-k dielectric layer. The second dielectric layer 12 may be formed by physical or chemical vapor deposition, or by atomic layer deposition (ALD). For example, the thickness of the second dielectric layer 12 may be about 15 Å to about 50 Å.

The intermediate dielectric layer 13 may be interposed between the first dielectric layer 11 and the second dielectric layer 12. The intermediate dielectric layer 13 may be also referred to as "a buffer layer". A material of the intermediate dielectric layer 13 may be represented by a formula of $A_xB_{1-x}O$, wherein "A" may include hafnium (Hf), zirconium (Zr), lanthanum (La) or tantalum (Ta), "B" may include lanthanum (La), aluminum (Al) or tantalum (Ta), "A" is different from "B", "O" is oxygen, and "x" is a number less than 1 and greater than 0 (i.e., 0<x<1). For example, the intermediate dielectric layer 13 may include but not limited to $Hf_xLa_{1-x}O$, $Hf_xAl_{1-x}O$, $Hf_xTa_{1-x}O$, $Zr_xLa_{1-x}O$, $Zr_xAl_{1-x}O$, $Zr_xTa_{1-x}O$, $La_xAl_{1-x}O$, $La_xTa_{1-x}O$ and $Ta_xAl_{1-x}O$. In some embodiments, the intermediate dielectric layer 13 may be selected from a group consisting of $Hf_xLa_{1-x}O$, $Hf_xAl_{1-x}O$, $Hf_xTa_{1-x}O$, $Zr_xLa_{1-x}O$, $Zr_xAl_{1-x}O$, $Zr_xTa_{1-x}O$, $La_xAl_{1-x}O$, $La_xTa_{1-x}O$ and $Ta_xAl_{1-x}O$. In some embodiments, when the multilayer structure 1 is used in a capacitor, the intermediate dielectric layer 13 with aluminum (Al) can result in lower leakage, and the intermediate dielectric layer 13 without aluminum (Al) can result in higher capacitance.

A bandgap of the intermediate dielectric layer 13 may be greater than a bandgap of $Ta_2O_5$. For example, the bandgap of the intermediate dielectric layer 13 may be greater than 4.2 eV, or may be greater than 4.5 eV. The high bandgap of the intermediate dielectric layer 13 may prevent leakage current when the multilayer structure 1 is used in a capacitor. In addition, a crystalline temperature of the intermediate dielectric layer 13 may be greater than 400 degrees centigrade, may be greater than 500 degrees centigrade, may be greater than 600 degrees centigrade, may be greater than 700 degrees centigrade, or may be greater than 800 degrees centigrade. The high crystalline temperature of the intermediate dielectric layer 13 may prevent crystallization of the first dielectric layer 11 and the second dielectric layer 12 (i.e., more than 75% by volume of the first dielectric layer 11 and the second dielectric layer 12 is amorphous) when the multilayer structure 1 is used in a capacitor. That is, the high crystalline temperature of the intermediate dielectric layer 13 may suppress the first dielectric layer 11 and the second dielectric layer 12 from crystallization when the multilayer structure 1 is used in a capacitor.

The dielectric constant ($\varepsilon_k$) of the intermediate dielectric layer 13 may be greater than 12, may be greater than 15, or may be greater than 20. Thus, the intermediate dielectric layer 13 may be a high-k dielectric layer. The intermediate dielectric layer 13 may be formed by physical or chemical vapor deposition, or by atomic layer deposition (ALD). A thickness of the intermediate dielectric layer 13 may be greater than 2 Å. For example, the thickness of the intermediate dielectric layer 13 may be about 5 Å to about 25 Å. In some embodiments, the thickness of the intermediate dielectric layer 13 may be different from the thickness of the first dielectric layer 11 and the thickness of the second dielectric layer 12. The thickness of the first dielectric layer 11 may be greater than the thickness of the intermediate dielectric layer 13. The thickness of the second dielectric layer 12 may be greater than the thickness of the intermediate dielectric layer 13.

In some embodiments, the material of the intermediate dielectric layer 13 may include the material of the first dielectric layer 11 (or the material of the second dielectric layer 12) and one or more additional elements. The bandgap of an oxide of the additional element may be greater than the bandgap of $Ta_2O_5$, or may by greater than 4.2 eV or 4.5 eV. The additional element may include but not limited to lanthanum (La), aluminum (Al) or tantalum (Ta). In some embodiments, the additional element may be selected from a group consisting of lanthanum (La), aluminum (Al) and tantalum (Ta).

Figure 2:
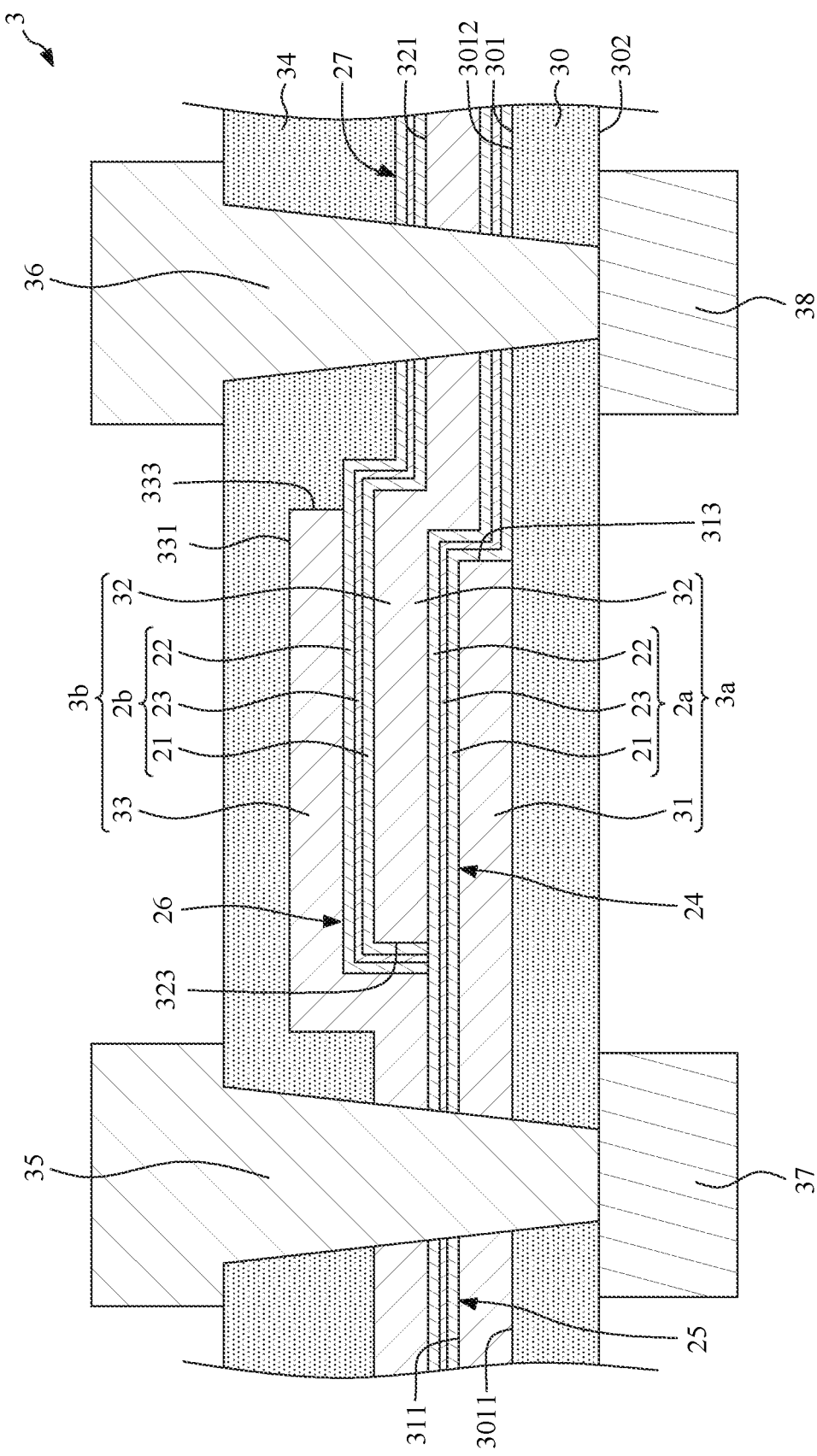
FIG. 2 illustrates a cross-sectional view of an example of a capacitor structure according to some embodiments of the present disclosure.

FIG. 2 illustrates a cross-sectional view of an example of a capacitor structure 3 according to some embodiments of the present disclosure. The capacitor structure 3 may include a base layer 30, a first conductive layer 31, a first intermediate structure 2a, a second conductive layer 32, a second intermediate structure 2b, a third conductive layer 33, an upper layer 34, a first via 35, a second via 36, a first pad 37 and a second pad 38. The capacitor structure 3 may be a planar capacitor.

The base layer 30 may include an insulation material or a semiconductor material. The base layer 30 may have a top surface 301. The top surface 301 of the base layer 30 may include a first portion 3011 and a second portion 3012. The first conductive layer 31 may include a conductive material such as copper, and may be also referred to as "a first electrode". The first conductive layer 31 may be disposed on the first portion 3011 of the top surface 301 of the base layer 30 to cover and contact the first portion 3011 of the top surface 301 of the base layer 30. The first conductive layer 31 may have a top surface 311 and a lateral surface 313.

The first intermediate structure 2a may include a first dielectric layer 21, a second dielectric layer 22 and an intermediate dielectric layer 23 disposed between the first dielectric layer 21 and the second dielectric layer 22. The first intermediate structure 2a may be same as or similar to the multilayer structure 1 of FIG. 1. Thus, the first dielectric layer 21, the second dielectric layer 22 and the intermediate dielectric layer 23 of the first intermediate structure 2a may be same as or similar to the first dielectric layer 11, the second dielectric layer 12 and the intermediate dielectric layer 13 of the multilayer structure 1 of FIG. 1, respectively. The first intermediate structure 2a covers and contacts the top surface 311 and the lateral surface 313 of the first conductive layer 31, and covers and contacts the second portion 3012 of the top surface 301 of the base layer 30. The first intermediate structure 2a may include a first portion 24 and a second portion 25. A thickness of the first intermediate structure 2a may be less than a thickness of the first conductive layer 31.

The second conductive layer 32 may include a conductive material such as copper, and may be also referred to as "a second electrode". The second conductive layer 32 may be disposed on the first portion 24 of the first intermediate structure 2a to cover and contact the first portion 24 of the first intermediate structure 2a. The second conductive layer 32 may be conformal with the first intermediate structure 2a, but may not extend to the second portion 25 of the first intermediate structure 2a. The second conductive layer 32 may have a top surface 321 and a lateral surface 323. A thickness of the second conductive layer 32 may be substantially equal to the thickness of the first conductive layer 31.

The second intermediate structure 2b may include a first dielectric layer 21, a second dielectric layer 22 and an intermediate dielectric layer 23 disposed between the first dielectric layer 21 and the second dielectric layer 22. The second intermediate structure 2b may be same as or similar to the multilayer structure 1 of FIG. 1. Thus, the first dielectric layer 21, the second dielectric layer 22 and the intermediate dielectric layer 23 of the second intermediate structure 2b may be same as or similar to the first dielectric layer 11, the second dielectric layer 12 and the intermediate dielectric layer 13 of the multilayer structure 1 of FIG. 1, respectively. The second intermediate structure 2b covers and contacts the top surface 321 and the lateral surface 323 of the second conductive layer 32. The second intermediate structure 2b may not extend to the second portion 25 of the first intermediate structure 2a. The second intermediate structure 2b may be conformal with the second conductive layer 32. The second intermediate structure 2b may include a first portion 26 and a second portion 27. A thickness of the second intermediate structure 2b may be less than a thickness of the second conductive layer 32.

The third conductive layer 33 may include a conductive material such as copper, and may be also referred to as "a third electrode". The third conductive layer 33 may be disposed on the first portion 26 of the second intermediate structure 2b to cover and contact the first portion 26 of the second intermediate structure 2b. The third conductive layer 33 may not extend to the second portion 27 of the second intermediate structure 2b. The third conductive layer 33 may have a top surface 331 and a lateral surface 333. A thickness of third conductive layer 33 may be substantially equal to the thickness of the second conductive layer 32.

The upper layer 34 may include an insulation material, and may cover and contact the top surface 331 and the lateral surface 333 of the third conductive layer 33 and the second portion 27 of the second intermediate structure 2b. The first pad 37 and the second pad 38 may be disposed adjacent to the bottom surface 302 of the base layer 30. The first via 35 may extend through the base layer 30, the first conductive layer 31, the first intermediate structure 2a, the third conductive layer 33 and the upper layer 34, and may electrically connect the first pad 37. The second via 36 may extend through the base layer 30, the first intermediate structure 2a, the second conductive layer 32, the second intermediate structure 2b and the upper layer 34, and may electrically connect the second pad 38.

As shown in FIG. 2, the first conductive layer 31, the second conductive layer 32 and the first intermediate structure 2a disposed between the first conductive layer 31 and the second conductive layer 32 may form a first capacitor 3a. The second conductive layer 32, the third conductive layer 33 and the second intermediate structure 2b disposed between the second conductive layer 32 and the third conductive layer 33 may form a second capacitor 3b. The first capacitor 3a and the second capacitor 3b are electrically connected in parallel.

Figure 3:
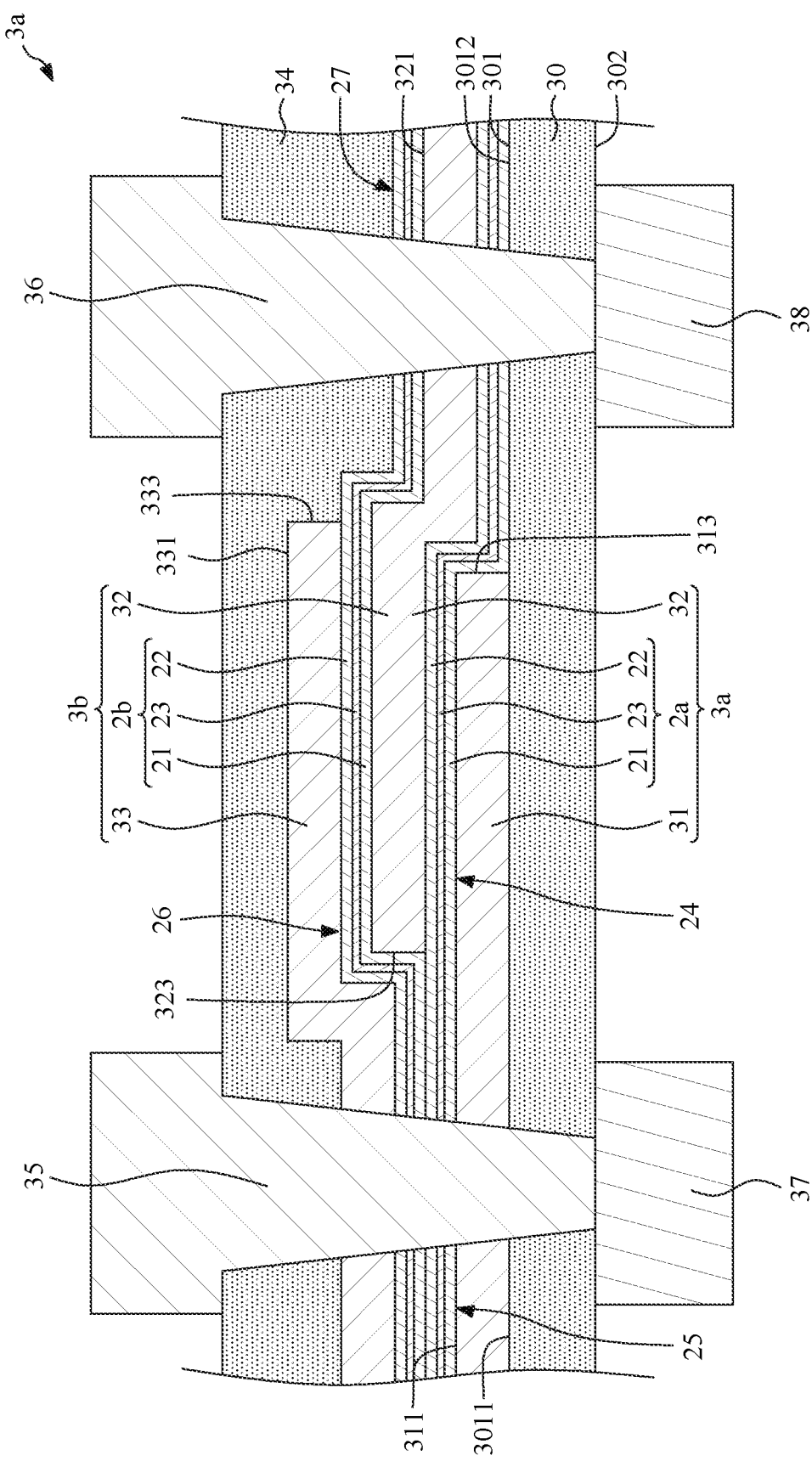
FIG. 3 illustrates a cross-sectional view of an example of a capacitor structure according to some embodiments of the present disclosure.

FIG. 3 illustrates a cross-sectional view of an example of a capacitor structure 3a according to some embodiments of the present disclosure. The capacitor structure 3a of FIG. 3 is similar to the capacitor structure 3 of FIG. 2, except that the second intermediate structure 2b may extend to the second portion 25 of the first intermediate structure 2a. Thus, the third conductive layer 33 may be conformal with the second intermediate structure 2b.

Figure 4:
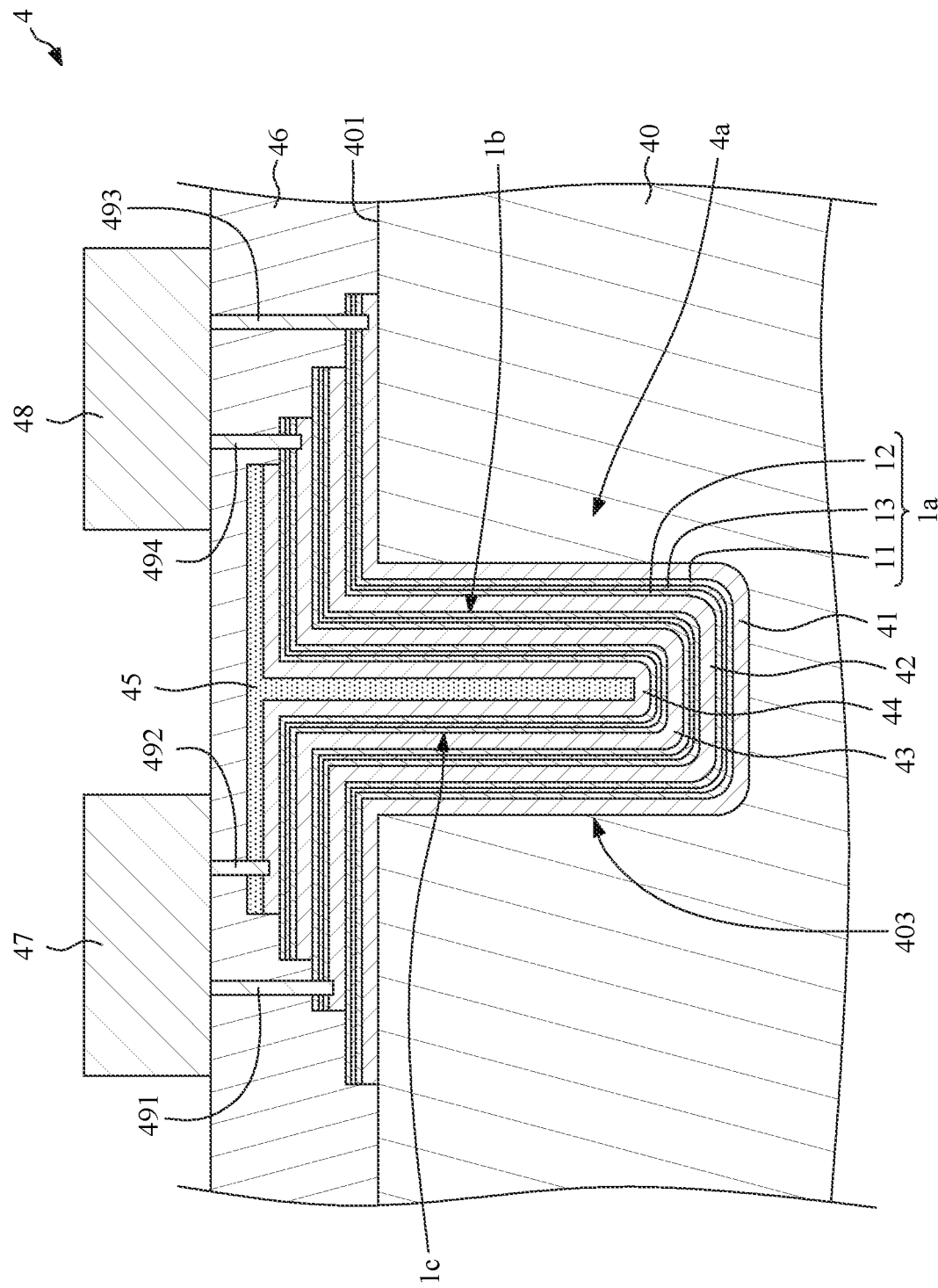
FIG. 4 illustrates a cross-sectional view of an example of a capacitor structure according to some embodiments of the present disclosure.

FIG. 4 illustrates a cross-sectional view of an example of a capacitor structure 4 according to some embodiments of the present disclosure. The capacitor structure 4 may include a substrate 40, a main portion 4a (including a first conductive layer 41, a first intermediate structure 1a, a second conductive layer 42, a second intermediate structure 1b, a third conductive layer 43, a third intermediate structure 1c, a fourth conductive layer 44 and a center insulation material 45), an upper layer 46, a first via 491, a second via 492, a third via 493, a fourth via 494, a first pad 47 and a second pad 48. The capacitor structure 4 may be a depth trench capacitor (DTC). Alternatively, the main portion 4a may be also referred to as a capacitor structure such as a depth trench capacitor (DTC).

The substrate 40 may include an insulation material or a semiconductor material. The substrate 40 may have a top surface 401. The substrate 40 may define a trench 403 recessed from the top surface 401. The first conductive layer 41 may include a conductive material such as copper, and may be also referred to as "a first electrode". The first conductive layer 41 may be disposed in the trench 403 and on the top surface 401. The first conductive layer 41 may be conformal with a sidewall and a bottom wall of the trench 403 and the top surface 401.

The first intermediate structure 1a may include a first dielectric layer 11, a second dielectric layer 12 and an intermediate dielectric layer 13 disposed between the first dielectric layer 11 and the second dielectric layer 12. The first intermediate structure 1a may be same as or similar to the multilayer structure 1 of FIG. 1. Thus, the first dielectric layer 11, the second dielectric layer 12 and the intermediate dielectric layer 13 of the first intermediate structure 1a may be same as or similar to the first dielectric layer 11, the second dielectric layer 12 and the intermediate dielectric layer 13 of the multilayer structure 1 of FIG. 1, respectively. The first intermediate structure 1a may be disposed on the first conductive layer 41 to cover and contact the first conductive layer 41. The first intermediate structure 1a may be conformal with the first conductive layer 41. A thickness of the first intermediate structure 1a may be less than a thickness of the first conductive layer 41.

The second conductive layer 42 may include a conductive material such as copper, and may be also referred to as "a second electrode". The second conductive layer 42 may be disposed on the first intermediate structure 1a. The second conductive layer 42 may be substantially conformal with the first intermediate structure 1a. A thickness of the second conductive layer 42 may be substantially equal to the thickness of the first conductive layer 41.

The second intermediate structure 1b may be same as or similar to the first intermediate structure 1a, and may include a first dielectric layer 11, a second dielectric layer 12 and an intermediate dielectric layer 13 disposed between the first dielectric layer 11 and the second dielectric layer 12. The second intermediate structure 1b may be disposed on the second conductive layer 42 to cover and contact the second conductive layer 42. The second intermediate structure 1b may be conformal with the second conductive layer 42. A thickness of the second intermediate structure 1b may be substantially equal to the thickness of the first intermediate structure 1a.

The third conductive layer 43 may include a conductive material such as copper, and may be also referred to as "a third electrode". The third conductive layer 43 may be disposed on the second intermediate structure 1b. The third conductive layer 43 may be substantially conformal with the second intermediate structure 1b. A thickness of the third conductive layer 43 may be substantially equal to the thickness of the second conductive layer 42.

The third intermediate structure 1c may be same as or similar to the first intermediate structure 1a, and may include a first dielectric layer 11, a second dielectric layer 12 and an intermediate dielectric layer 13 disposed between the first dielectric layer 11 and the second dielectric layer 12. The third intermediate structure 1c may be disposed on the third conductive layer 43 to cover and contact the third conductive layer 43. The third intermediate structure 1c may be conformal with the third conductive layer 43. A thickness of the third intermediate structure 1c may be substantially equal to the thickness of the second intermediate structure 1b.

The fourth conductive layer 44 may include a conductive material such as copper, and may be also referred to as "a fourth electrode". The fourth conductive layer 44 may be disposed on the third intermediate structure 1c. The fourth conductive layer 44 may be substantially conformal with the third intermediate structure 1c. A thickness of the fourth conductive layer 44 may be substantially equal to the thickness of the third conductive layer 43. The center insulation material 45 may fill the central hole defined by the fourth conductive layer 44 and on the fourth conductive layer 44.

The upper layer 46 may include an insulation material, and may cover and contact the center insulation material 45 and the top surface 401 of the substrate 40. The first pad 47 and the second pad 48 may be disposed on the upper layer 46. The first via 491 may be disposed in the upper layer 46, and may electrically connect the first pad 47 and the second conductive layer 42. The second via 492 may be disposed in the upper layer 46, and may electrically connect the first pad 47 and the fourth conductive layer 44. The third via 493 may be disposed in the upper layer 46, and may electrically connect the second pad 48 and the first conductive layer 42. The fourth via 494 may be disposed in the upper layer 46, and may electrically connect the second pad 48 and the third conductive layer 43.

Figure 5:
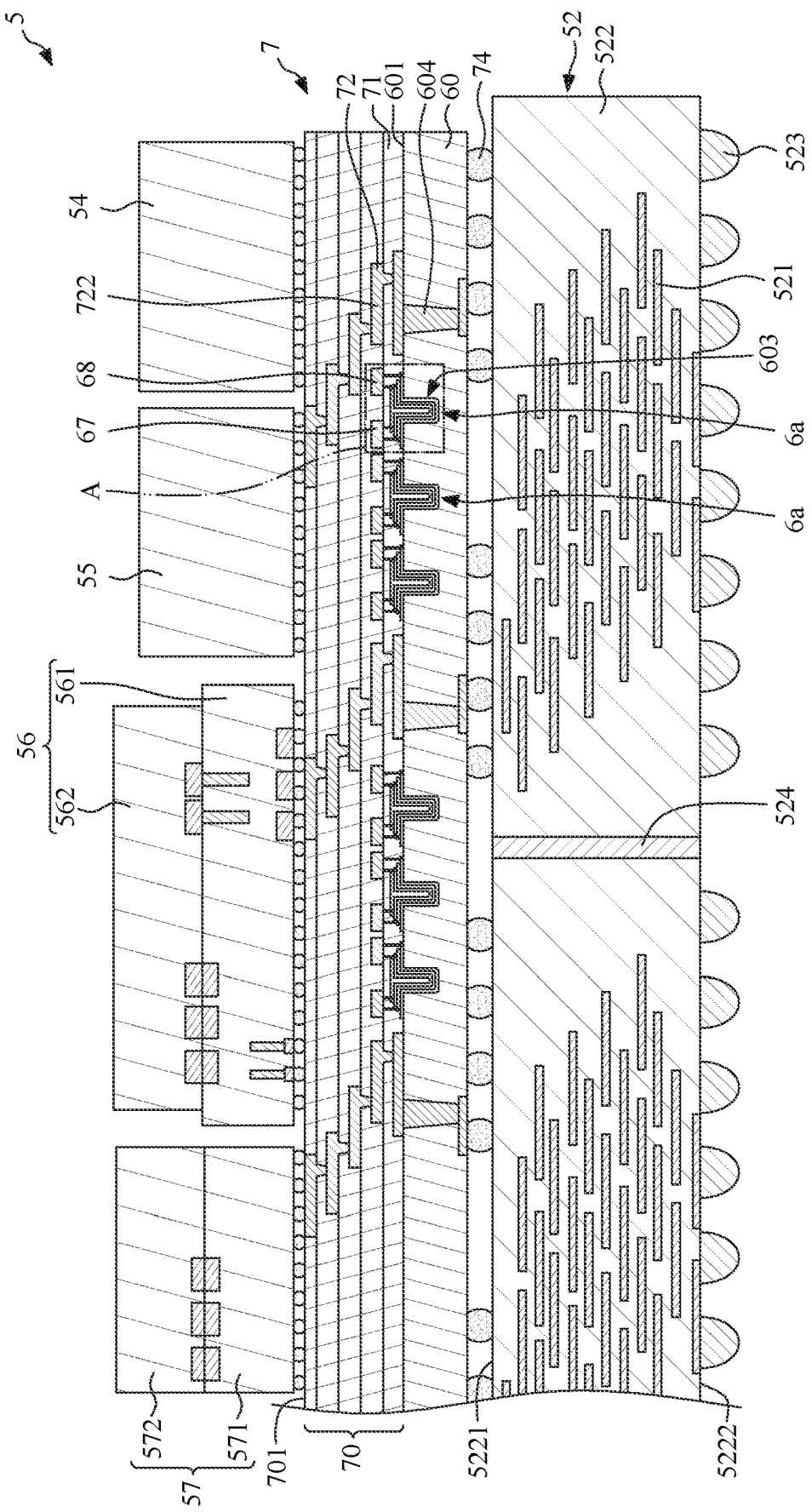
FIG. 5 illustrates a cross-sectional view of an example of a portion of an assembly structure according to some embodiments of the present disclosure.

FIG. 5 illustrates a cross-sectional view of an example of a portion of an assembly structure 5 according to some embodiments of the present disclosure. The assembly structure 5 may be a package structure. The assembly structure 5 may include a carrier 52, an electronic device 7 and a first semiconductor chip 54, a second semiconductor chip 55, a chip assembly 56, a die assembly 57.

The carrier 52 may include a dielectric structure 522, a plurality of circuit layers 521, at least one through via 524 and a plurality of solders 523. The dielectric structure 522 may include a plurality of dielectric layers stacked on one another. The dielectric structure 522 may have a top surface 5221 and a bottom surface 5222 opposite to the top surface 5221. The circuit layers 521 may be embedded in the dielectric structure 522 and may be electrically connected to each other. The at least one through via 524 may extend through the dielectric structure 522.

The electronic device 7 may be an interposer. The electronic device 7 may be physically connected and electrically connected to the top surface 5221 of the dielectric structure 522 of the carrier 52 through a plurality of solders 74. The electronic device 7 may include a substrate 60 and a dielectric structure 70 disposed on the substrate 60. The substrate 60 may include an insulation material or a semiconductor material. The substrate 60 may have a top surface 601, and may define a trench 603. The substrate 60 may include at least one capacitor structure 6a and at least one conductive through via 604. The capacitor structure 6a may be disposed in the trench 603. The conductive through via 604 may extend through the substrate 60.

The dielectric structure 70 may include a plurality of dielectric layers 71 stacked on one another. The dielectric structure 70 may have a top surface 701. The electronic device 7 may further include at least one circuit layer 72 embedded in the dielectric structure 70. The at least one circuit layer 72 may include a plurality of circuit layers 72 electrically connected to each other, and may include a second circuit layer 722. The at least one circuit layer 72 may be electrically connected to the conductive through via 604 of the substrate 60.

The first semiconductor chip 54 may be physically connected and electrically connected to the top surface 701 of the dielectric structure 70 of the electronic device 7 through a plurality of solders. The first semiconductor chip 54 may be a memory chip. The second semiconductor chip 55 may be physically connected and electrically connected to the top surface 701 of the dielectric structure 70 of the electronic device 7 through a plurality of solders. The second semiconductor chip 55 may be an application specific integrated circuit (ASIC) chip. The chip assembly 56 may be physically connected and electrically connected to the top surface 701 of the dielectric structure 70 of the electronic device 7 through a plurality of solders. The chip assembly 56 may include a first chip 561 and a second chip 562. An active surface of the first chip 561 may be bonded or attached to an active surface of the second chip 562. The die assembly 57 may be physically connected and electrically connected to the top surface 701 of the dielectric structure 70 of the electronic device 7 through a plurality of solders. The die assembly 57 may include a first die 571 and a second die 572. The first die 571 may be a photonic die (P-die). The second die 572 may be an electronic die (E-die). An active surface of the first die 571 may be bonded or attached to an active surface of the second die 572.

Figure 5A:
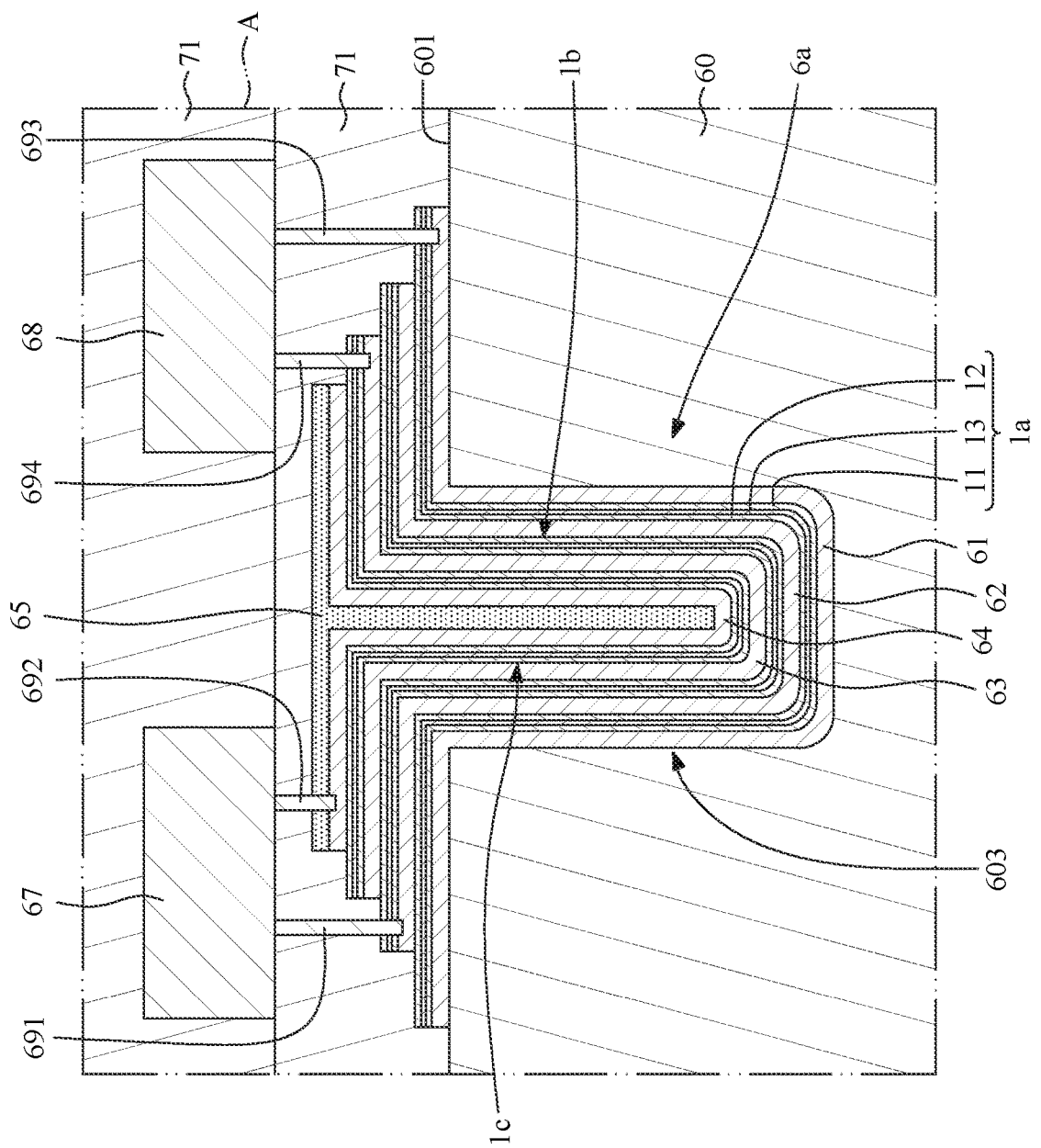
FIG. 5A illustrates an enlarged view of an area "A" of FIG. 5.

FIG. 5A illustrates an enlarged view of an area "A" of FIG. 5. The capacitor structure 6a may include a first conductive layer 61, a first intermediate structure 1a, a second conductive layer 62, a second intermediate structure 1b, a third conductive layer 63, a third intermediate structure 1c, a fourth conductive layer 64 and a center insulation material 65. The capacitor structure 6a of FIG. 5A may be same as or similar to the main portion 4a of the capacitor structure 4 of FIG. 4. Thus, the first conductive layer 61, the first intermediate structure 1a, the second conductive layer 62, the second intermediate structure 1b, the third conductive layer 63, the third intermediate structure 1c, the fourth conductive layer 64 and a center insulation material 65 of FIG. 5A may be same as or similar to the first conductive layer 41, the first intermediate structure 1a, the second conductive layer 42, the second intermediate structure 1b, the third conductive layer 43, the third intermediate structure 1c, the fourth conductive layer 44 and the center insulation material 45 of FIG. 4.

The electronic device 7 may further include a first via 691, a second via 692, a third via 693, a fourth via 694, a first pad 67 and a second pad 68 embedded in the dielectric layers 71 of the dielectric structure 70. The first via 691, the second via 692, the third via 693, the fourth via 694, the first pad 67 and the second pad 68 of FIG. 5A may be same as or similar to the first via 491, the second via 492, the third via 493, the fourth via 494, the first pad 47 and the second pad 48 of FIG. 4, respectively. The first pad 67 and the second pad 68 may be disposed above the substrate 60, and may be electrically connected to the capacitor structure 6a through the first via 691, the second via 692, the third via 693 and the fourth via 694. As shown in FIG. 5, the first pad 67, the second pad 68 and the second circuit layer 722 may be at the same layer. Alternatively, the first pad 67 and the second pad 68 may be a portion of the second circuit layer 722.

Figure 6:
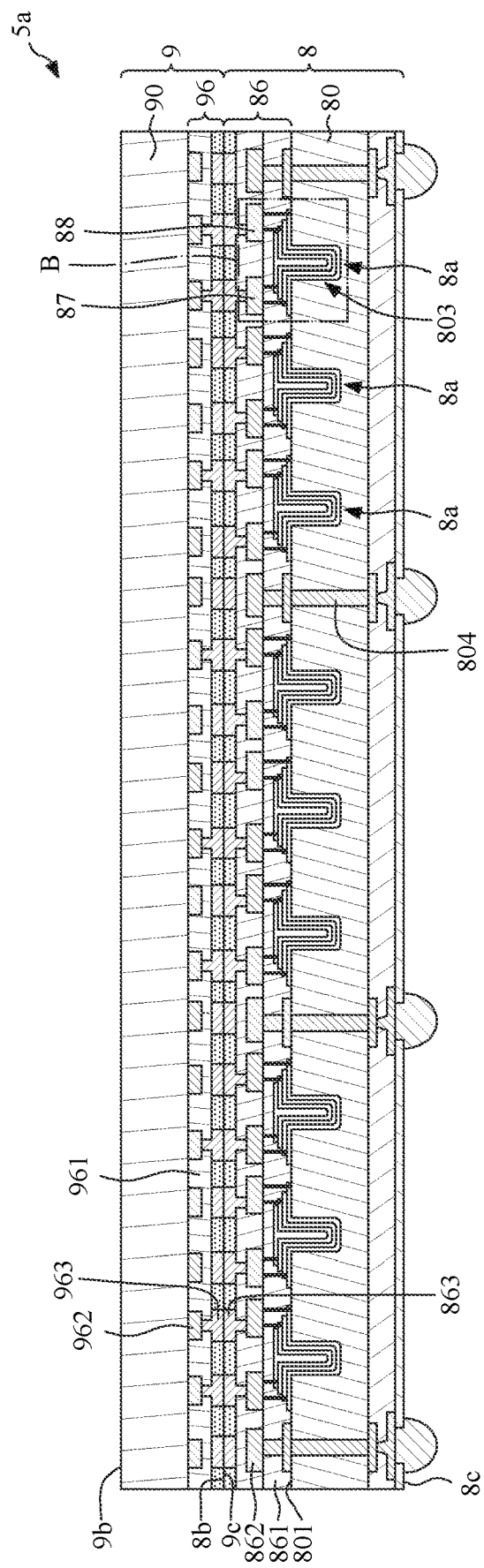
FIG. 6 illustrates a cross-sectional view of an example of an assembly structure according to some embodiments of the present disclosure.

FIG. 6 illustrates a cross-sectional view of an example of an assembly structure 5a according to some embodiments of the present disclosure. The assembly structure 5a may be a package structure, an electronic device, a chip assembly, or a die assembly manufactured by a wafer-on-wafer (WOW) technique. The assembly structure 5a may include a bottom electronic device 8 and a top electronic device 9.

The bottom electronic device 8 may be a semiconductor device such as a semiconductor die or a semiconductor chip. The bottom electronic device 8 may have a top surface 8b (e.g., an active surface) and a bottom surface 8c (e.g., a backside surface) opposite to the top surface 8b. The bottom electronic device 8 may include a substrate 80 and a dielectric structure 86 disposed on the substrate 80. The substrate 80 may include an insulation material or a semiconductor material. The substrate 80 may have a top surface 801, and may define a trench 803. The substrate 80 may include at least one capacitor structure 8a and at least one conductive through via 804. The capacitor structure 8a may be disposed in the trench 803. The conductive through via 804 may extend through the substrate 80.

The dielectric structure 86 may include a plurality of dielectric layers 861 stacked on one another. The dielectric structure 86 may have a top surface 8b. The bottom electronic device 8 may further include at least one circuit layer 862 embedded in the dielectric structure 86. The at least one circuit layer 862 may include a plurality of circuit layers 862 electrically connected to each other. The at least one circuit layer 862 may be electrically connected to the conductive through via 804 of the substrate 80. In some embodiments, the at least one circuit layer 862 may be a portion of a back end of line (BEOL) structure. The bottom electronic device 8 may further include at least one bonding pad 863 exposed from the top surface 8b (e.g., active surface).

The top electronic device 9 may be a semiconductor device such as a semiconductor logic die or a semiconductor logic chip. The top electronic device 9 may have a top surface 9b (e.g., a backside surface) and a bottom surface 9c (e.g., an active surface) opposite to the top surface 9b. The top electronic device 9 may include a substrate 90 and a dielectric structure 96 disposed on the substrate 90. The substrate 90 may include an insulation material or a semiconductor material.

The dielectric structure 96 may include a plurality of dielectric layers 961 stacked on one another. The top electronic device 9 may further include at least one circuit layer 962 embedded in the dielectric structure 96. The at least one circuit layer 962 may include a plurality of circuit layers 962 electrically connected to each other. In some embodiments, the at least one circuit layer 962 may be a portion of a back end of line (BEOL) structure. The top electronic device 9 may further include at least one bonding pad 963 exposed from the bottom surface 9c (e.g., active surface). The bonding pad 963 exposed from the bottom surface 9c (e.g., active surface) of the top electronic device 9 may be physically connected and electrically connected to the bonding pad 863 exposed from the top surface 8b (e.g., active surface) of the bottom electronic device 8 directly. In some embodiments, the bonding pad 963 and the bottom surface 9c (e.g., active surface) of the top electronic device 9 may be bonded or attached to the bonding pad 863 and the top surface 8b (e.g., active surface) of the bottom electronic device 8 directly.

Figure 6A:
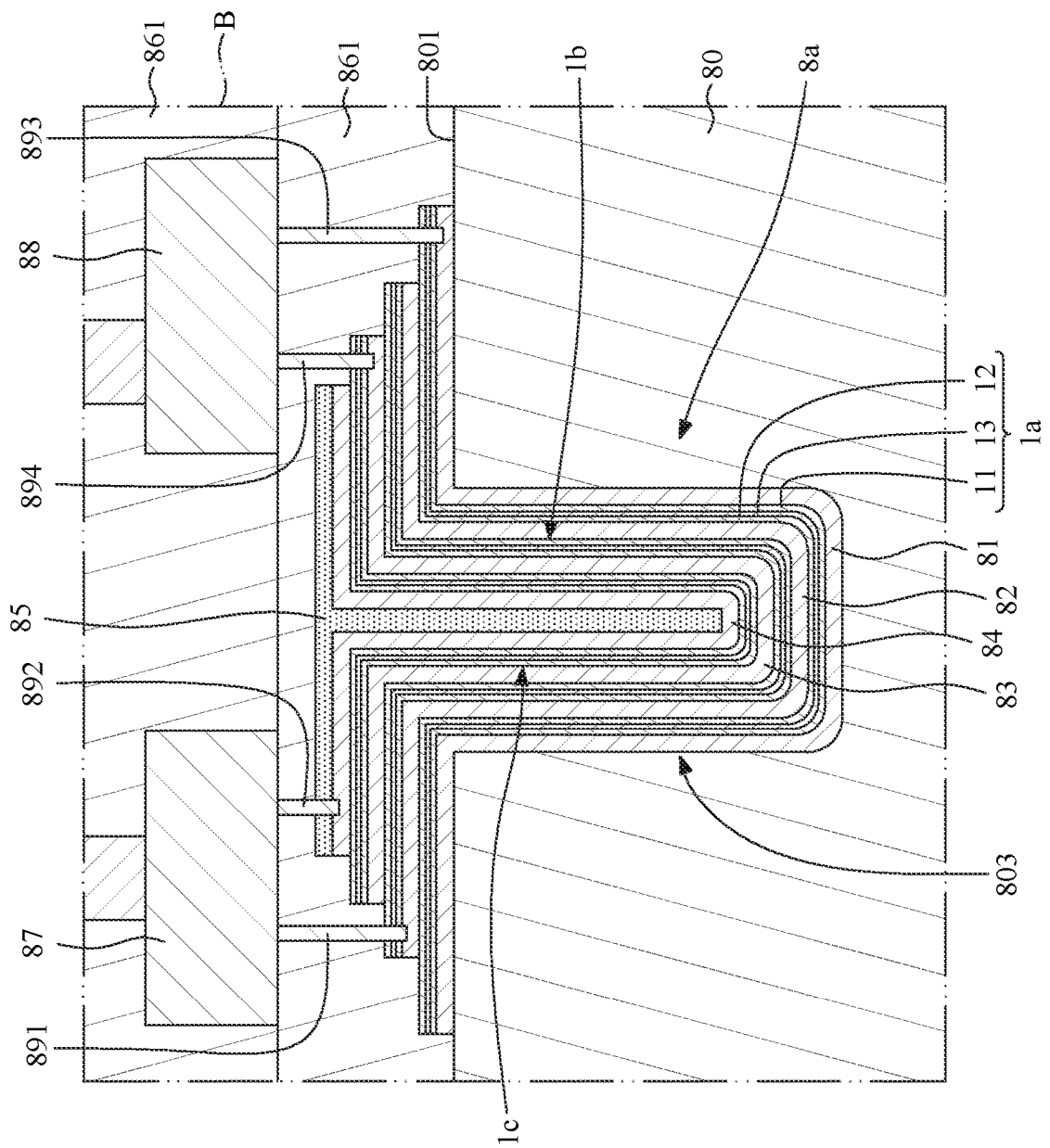
FIG. 6A illustrates an enlarged view of an area "B" of FIG. 6.

FIG. 6A illustrates an enlarged view of an area "B" of FIG. 6. The capacitor structure 8a may include a first conductive layer 81, a first intermediate structure 1a, a second conductive layer 82, a second intermediate structure 1b, a third conductive layer 83, a third intermediate structure 1c, a fourth conductive layer 84 and a center insulation material 85. The capacitor structure 8a of FIG. 6A may be same as or similar to the main portion 4a of the capacitor structure 4 of FIG. 4. Thus, the first conductive layer 81, the first intermediate structure 1a, the second conductive layer 82, the second intermediate structure 1b, the third conductive layer 83, the third intermediate structure 1c, the fourth conductive layer 84 and a center insulation material 85 of FIG. 6A may be same as or similar to the first conductive layer 41, the first intermediate structure 1a, the second conductive layer 42, the second intermediate structure 1b, the third conductive layer 43, the third intermediate structure 1c, the fourth conductive layer 44 and the center insulation material 45 of FIG. 4.

The bottom electronic device 8 may further include a first via 891, a second via 892, a third via 893, a fourth via 894, a first pad 87 and a second pad 88 embedded in the dielectric layers 861 of the dielectric structure 86. The first via 891, the second via 892, the third via 893, the fourth via 894, the first pad 87 and the second pad 88 of FIG. 6A may be same as or similar to the first via 491, the second via 492, the third via 493, the fourth via 494, the first pad 47 and the second pad 48 of FIG. 4, respectively. The first pad 87 and the second pad 88 may be disposed above the substrate 80, and may be electrically connected to the capacitor structure 8a through the first via 891, the second via 892, the third via 893 and the fourth via 894. As shown in FIG. 6, the first pad 87, the second pad 88 and the circuit layer 862 may be at the same layer. Alternatively, the first pad 87 and the second pad 8 may be a portion of the circuit layer 862.

In accordance with some embodiments of the present disclosure, a multilayer structure includes a first dielectric layer, a second dielectric layer and an intermediate dielectric layer. The intermediate dielectric layer is disposed between the first dielectric layer and the second dielectric layer. A material of the intermediate dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0.

In accordance with some embodiments of the present disclosure, a capacitor structure includes a first conductive layer, a second conductive layer and an intermediate structure. The intermediate structure is disposed between the first conductive layer and the second conductive layer. The intermediate structure includes a first dielectric layer a second dielectric layer and an intermediate dielectric layer. The intermediate dielectric layer is disposed between the first dielectric layer and the second dielectric layer. A bandgap of the intermediate dielectric layer is greater than 4.2 eV.

In accordance with some embodiments of the present disclosure, an electronic device includes a substrate, a capacitor structure, a pad and a conductive through via. The substrate defines a trench. The capacitor structure is disposed in the trench, and includes a high-k dielectric layer. A material of the high-k dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0. The pad is disposed above the substrate and electrically connected to the capacitor structure. The conductive through via extends through the substrate and is electrically connected to the pad.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multilayer structure, comprising:
a first dielectric layer;
a second dielectric layer; and
an intermediate dielectric layer disposed between the first dielectric layer and the second dielectric layer, wherein a material of the intermediate dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0.

2. The multilayer structure of claim 1, wherein a material of the first dielectric layer includes hafnium oxide ($HfO_2$) and/or zirconium oxide ($ZrO_2$), and a material of the second dielectric layer includes hafnium oxide ($HfO_2$) and/or zirconium oxide ($ZrO_2$).

3. The multilayer structure of claim 1, wherein a bandgap of the intermediate dielectric layer is greater than 4.2 eV.

4. The multilayer structure of claim 1, wherein a crystalline temperature of the intermediate dielectric layer is greater than 400 degrees centigrade.

5. The multilayer structure of claim 1, wherein a thickness of the first dielectric layer is greater than a thickness of the intermediate dielectric layer, and a thickness of the second dielectric layer is greater than the thickness of the intermediate dielectric layer.

6. The multilayer structure of claim 1, wherein a dielectric constant of the intermediate dielectric layer is greater than 12.

7. The multilayer structure of claim 1, further comprising a third dielectric layer, wherein an end surface of the first dielectric layer, an end surface of the second dielectric layer and an end surface of the intermediate dielectric layer are coplanar with each other, and the third dielectric layer contacts the end surface of the first dielectric layer, the end surface of the second dielectric layer and the end surface of the intermediate dielectric layer.

8. A capacitor structure, comprising:
a first conductive layer;
a second conductive layer; and
a first intermediate structure disposed between the first conductive layer and the second conductive layer, and including:
a first dielectric layer;
a second dielectric layer; and
an intermediate dielectric layer disposed between the first dielectric layer and the second dielectric layer, wherein a bandgap of the intermediate dielectric layer is greater than 4.2 eV.

9. The capacitor structure of claim 8, wherein the bandgap of the intermediate dielectric layer is greater than 4.5 eV.

10. The capacitor structure of claim 8, wherein a material of the first dielectric layer includes hafnium oxide ($HfO_2$) and/or zirconium oxide ($ZrO_2$), and a material of the second dielectric layer includes hafnium oxide ($HfO_2$) and/or zirconium oxide ($ZrO_2$).

11. The capacitor structure of claim 8, wherein a material of the intermediate dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0.

12. The capacitor structure of claim 8, wherein a crystalline temperature of the intermediate dielectric layer is greater than 400 degrees centigrade.

13. The capacitor structure of claim 8, further comprising a second intermediate structure contacting the first conductive layer, the second conductive layer and the first intermediate structure.

14. The capacitor structure of claim 13, further comprising a third conductive layer, wherein the second intermediate structure comprises a first surface contacting the first conductive layer, the second conductive layer and the first intermediate structure, and the third conductive layer is disposed on a second surface of the second intermediate structure opposite to the first surface.

15. The capacitor structure of claim 8, further comprising a second intermediate structure contacting the second conductive layer and the first intermediate structure, wherein the first intermediate structure comprises a first portion and a second portion, the second intermediate structure comprises a first portion and a second portion, the first portion of the first intermediate structure contacts the first portion of the second intermediate structure, and the second conductive layer is interposed between the second portion of the first intermediate structure and the second portion of the second intermediate structure.

16. An electronic device, comprising:
a substrate defining a trench;
a capacitor structure disposed in the trench, and including a high-k dielectric layer, wherein a material of the high-k dielectric layer is represented by a formula of $A_xB_{1-x}O$, wherein A includes hafnium (Hf), zirconium (Zr), lanthanum (La) or tantalum (Ta), B includes lanthanum (La), aluminum (Al) or tantalum (Ta), A is different from B, O is oxygen, and x is a number less than 1 and greater than 0;
a pad disposed above the substrate and electrically connected to the capacitor structure; and
a conductive through via extending through the substrate and electrically connected to the pad.

17. The electronic device of claim 16, wherein the capacitor structure further includes a first conductive layer, a second conductive layer, a first dielectric layer and a second dielectric layer, the high-k dielectric layer is interposed between the first dielectric layer and the second dielectric layer, and the first dielectric layer, the high-k dielectric layer and the second dielectric layer are interposed between the first conductive layer and the second conductive layer.

18. The electronic device of claim 16, further comprising a dielectric structure disposed on the substrate and including at least one circuit layer embedded in the dielectric structure, wherein the at least one circuit layer is electrically connected to the conductive through via.

19. The electronic device of claim 16, further comprising semiconductor device having an active surface bonded to an active surface of the electronic device.

20. The electronic device of claim 16, wherein the substrate comprises a first surface and a second surface opposite to the first surface, the trench is recessed from the first surface of the substrate, a length of the conductive through via is greater than a depth of the trench, the pad is disposed adjacent to the first surface of the substrate, and the conductive through via extends from the first surface of the substrate to the second surface of the substrate.

\* \* \* \* \*